(12) United States Patent
van Dal et al.

(10) Patent No.: US 11,990,514 B2
(45) Date of Patent: May 21, 2024

(54) PROTRUSION FIELD-EFFECT TRANSISTOR AND METHODS OF MAKING THE SAME

(71) Applicant: Taiwan Semiconductor Manufacturing Company Limited, Hsinchu (TW)

(72) Inventors: Marcus Johannes Henricus van Dal, Linden (BE); Gerben Doornbos, Kessel-Lo (BE); Georgios Vallianitis, Heverlee (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/101,592

(22) Filed: Jan. 26, 2023

(65) Prior Publication Data
US 2023/0170387 A1  Jun. 1, 2023

Related U.S. Application Data

(63) Continuation of application No. 17/222,028, filed on Apr. 5, 2021, now Pat. No. 11,569,352.
(Continued)

(51) Int. Cl.
*H01L 29/66* (2006.01)
*H01L 29/10* (2006.01)
(Continued)

(52) U.S. Cl.
CPC .......... *H01L 29/1037* (2013.01); *H01L 29/24* (2013.01); *H01L 29/41791* (2013.01);
(Continued)

(58) Field of Classification Search
CPC ............... H01L 29/1037; H01L 29/24; H01L 29/41791; H01L 29/4236; H01L 29/66969; H01L 29/7853; H01L 29/7854; H01L 29/66787; H01L 29/7869; H01L 29/78696; H01L 27/1207; H01L 21/823412; H01L 21/8258; H01L 27/0688; H01L 27/088
See application file for complete search history.

(56) References Cited

U.S. PATENT DOCUMENTS

2008/0237577 A1*  10/2008  Chui ..................... H01L 29/165
                                                              438/151
2015/0303299 A1*  10/2015  Chang ............... H01L 21/02568
                                                               257/29
(Continued)

FOREIGN PATENT DOCUMENTS

WO  WO-2018236357 A1 * 12/2018

*Primary Examiner* — Earl N Taylor
(74) *Attorney, Agent, or Firm* — The Marbury Law Group, PLLC

(57) ABSTRACT

A transistor, an integrated semiconductor device, and methods of making the same are provided. The transistor includes a dielectric layer having a plurality of dielectric protrusions, a channel layer conformally covering the protrusions of the dielectric layer to form a plurality of trenches between two adjacent dielectric protrusion, a gate layer disposed on the channel layer. The gate layer 106 has a plurality of gate protrusions fitted into the trenches. The transistor also includes active regions aside the gate layer. The active regions are electrically connected to the channel layer.

20 Claims, 15 Drawing Sheets

Related U.S. Application Data

(60) Provisional application No. 63/031,051, filed on May 28, 2020.

(51) Int. Cl.
*H01L 29/24* (2006.01)
*H01L 29/417* (2006.01)
*H01L 29/423* (2006.01)
*H01L 29/78* (2006.01)
*H01L 29/786* (2006.01)

(52) U.S. Cl.
CPC .... *H01L 29/4236* (2013.01); *H01L 29/66787* (2013.01); *H01L 29/66969* (2013.01); *H01L 29/7853* (2013.01); *H01L 29/7854* (2013.01); *H01L 29/7869* (2013.01); *H01L 29/78696* (2013.01)

(56) References Cited

U.S. PATENT DOCUMENTS

| | | | |
|---|---|---|---|
| 2017/0338323 A1* | 11/2017 | Cheng | H01L 29/161 |
| 2020/0006575 A1* | 1/2020 | Dewey | H01L 29/7869 |
| 2020/0035837 A1* | 1/2020 | Ahmed | H01L 29/78696 |
| 2020/0127142 A1* | 4/2020 | Dewey | B82Y 10/00 |
| 2020/0161473 A1* | 5/2020 | Majhi | H01L 29/78606 |
| 2020/0168636 A1* | 5/2020 | Majhi | H01L 29/66356 |
| 2020/0212075 A1* | 7/2020 | Doyle | H01L 29/78696 |
| 2020/0273779 A1* | 8/2020 | Lilak | H01L 27/0886 |
| 2020/0335635 A1* | 10/2020 | Sharma | H01L 29/7391 |
| 2020/0350412 A1* | 11/2020 | Ku | H01L 29/0847 |
| 2021/0265501 A1* | 8/2021 | Hung | H01L 21/76897 |
| 2022/0149192 A1* | 5/2022 | Maxey | H01L 29/24 |

* cited by examiner

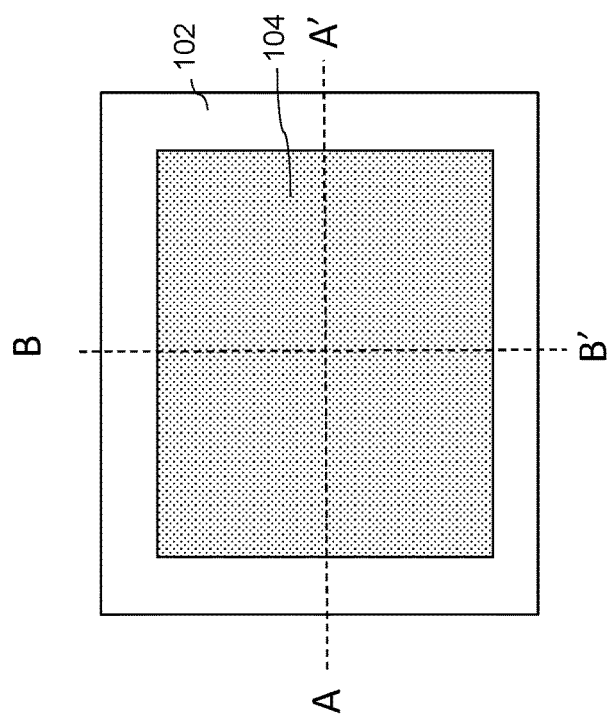
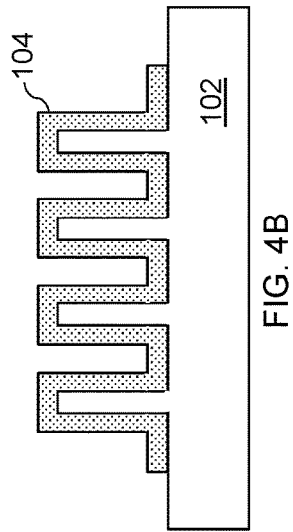
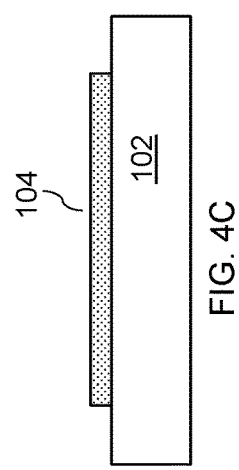
FIG. 4A
FIG. 4B
FIG. 4C

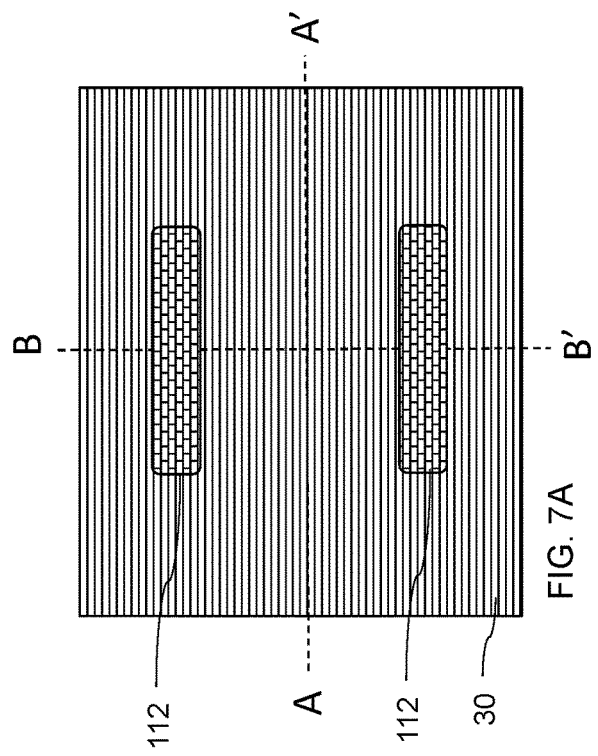
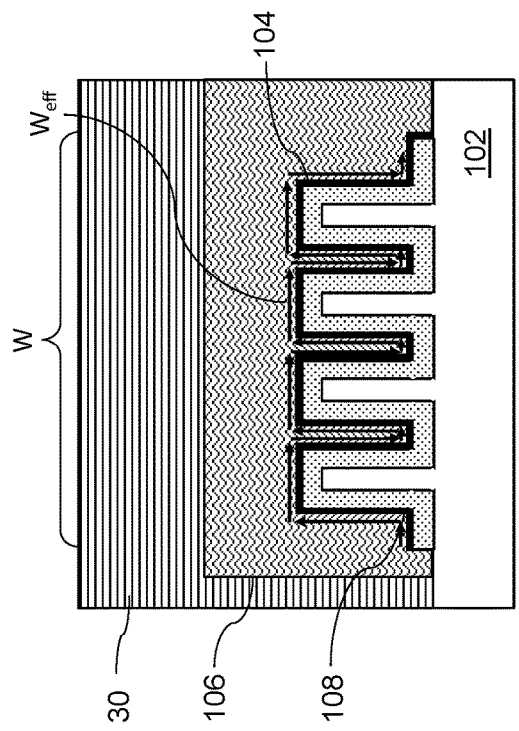
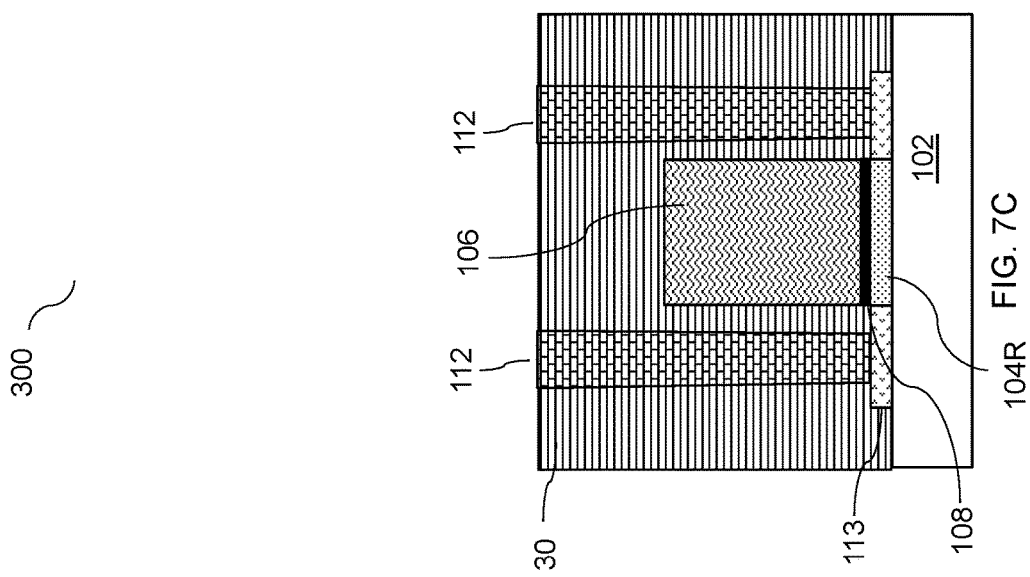
FIG. 7A
FIG. 7B
FIG. 7C

PROTRUSION FIELD-EFFECT TRANSISTOR AND METHODS OF MAKING THE SAME

RELATED APPLICATIONS

This application is a continuation application of U.S. application Ser. No. 17/222,028, entitled "Protrusion Field Effect Transistor and Methods of Making the Same, filed on Apr. 5, 2021, which claims priority from U.S. Provisional Patent Application No. 63/031,051 titled "GX Protrusion Back-Gate Thin Film Transistor" and filed on May 28, 2020, the entire contents of both of which are hereby incorporated by reference for all purposes.

BACKGROUND

In the semiconductor industry, there is constant desire to increase the areal density of integrated circuits. To do so, individual transistors have become increasingly smaller. However, the rate at which individual transistors may be made smaller is slowing. Moving peripheral transistors from the front-end-of-line (FEOL) to the back-end-of Line (BEOL) of fabrication may be advantageous because functionality may be added at the BEOL while valuable chip area may be made available in the FEOL. Thin film transistors (TFT) made of oxide semiconductors are an attractive option for BEOL integration since TFTs may be processed at low temperatures and thus, will not damage previously fabricated devices. However, thin film transistors are typically planar. As such, they have a relatively large areal footprint which prevents their use for routing and is therefore detrimental for chip area scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A is a top view illustrating a step of patterning the channel layer in a method of making a transistor according to an embodiment of the present disclosure.

FIG. 4B is a vertical cross-sectional view through line AA' of FIG. 4A.

FIG. 4C is a vertical cross-sectional view through line BB' of FIG. 4A.

FIG. 7A is a top view illustrating a step of depositing an interconnect level dielectric layer over the intermediate structure illustrated in FIGS. 6A-6C and forming active region contacts in a method of making a transistor according to an embodiment of the present disclosure.

FIG. 7B is a vertical cross-sectional view through line AA' of FIG. 7A.

FIG. 7C is a vertical cross-sectional view through line BB' of FIG. 7A.

DETAILED DESCRIPTION

Figure 1A:
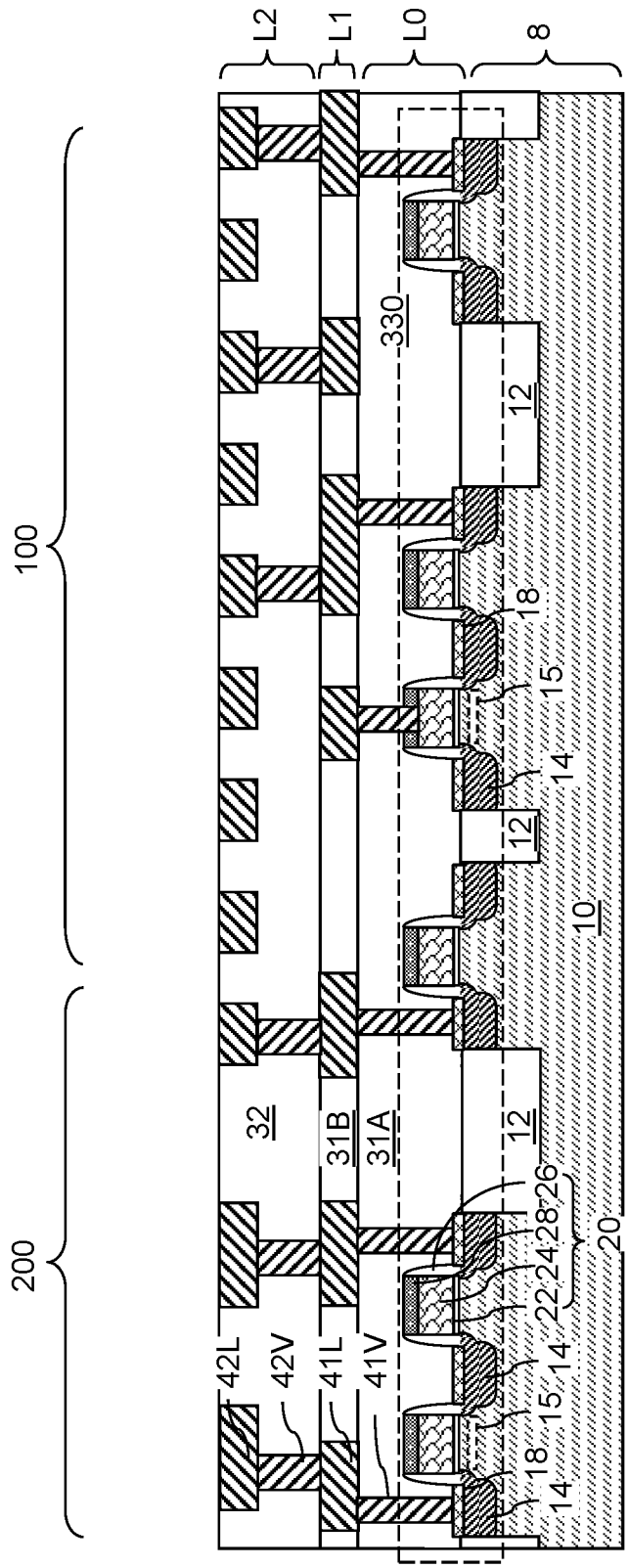
FIG. 1A is a vertical cross-sectional view of a first exemplary structure during prior to formation of an array of protrusion field effect transistors according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices, and specifically to protrusion field-effect transistors and methods of forming the same. Embodiments also include integrated circuits having protrusion field-effect transistors, especially protrusion thin-film field effect transistors located in the BEOL. In various embodiments, the protrusion field-effect transistors may have one or more protrusions with a protrusion width $P_W$ of 3-30 nm and a protrusion height $P_H$ of 10-250 nm.

Thin-film transistors (TFTs) provide a number of advantages for BEOL integration. For example, TFTs may be processed at low temperature and may add functionality to the BEOL while valuable chip area may be made available in the FEOL. Use of TFTs in the BEOL may be used as a scaling path for 3 nm node fabrication (N3) or beyond by moving peripheral devices such as power gates or Input/Output (I/O) devices from the FEOL into higher metal levels of the BEOL. Moving the TFTs from the FEOL to the BEOL may result in about 5-10% area shrink for a given device.

TFT's which may be moved from the FEOL to the BEOL include, but are not limited to, power gates, input/output elements and memory selectors. In current technology, power gates are logic transistors which are located in the FEOL. Power gates may be used to switch off logic blocks in standby, thereby reduce static power consumption. I/O devices are the interface between a computing element (e.g., CPU) and the outside world (e.g., a hard drive) and are also processed in the FEOL. The selector for a memory element, such as a magnetoresistive random-access memory (MRAM) or a resistive random-access memory (RRAM) is presently located in the FEOL and may be moved to the BEOL. Typically, there is one selector TFT for each memory element.

Back gate or bottom gate transistors have a gate electrode on the bottom of the TFT in contrast to a top gate transistor in which the gate electrode is located on the top of the transistor. In general, a bottom gate TFT may be fabricated as follows. First, a layer of gate metal may be deposited on a substrate and patterned to form a gate electrode. The substrate may be made of any suitable materials, such silicon or silicon-on-insulator. The gate metal may be made of copper, aluminum, zirconium, titanium, tungsten, tantalum, ruthenium, palladium, platinum, cobalt, nickel or alloys thereof. Other suitable materials are within the contemplated scope of disclosure. The gate metal may be deposited by any suitable technique, such as chemical vapor deposition (CVD), physical vapor deposition (PVD) plasma enhanced chemical vapor deposition (PECVD) or atomic layer deposition (ALD).

Next, a high-k dielectric layer may be deposited over the gate electrode. High-k dielectric materials are materials with a dielectric constant higher than silicon dioxide and include, but are not limited to, hafnium oxide (HfO2), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina (HfO2-Al2O3). Other suitable materials are within the contemplated scope of disclosure.

Next a layer of semiconducting material may be deposited over the high-k dielectric layer. The layer of semiconducting material may be patterned and ion implanted to form active regions (source/drain regions) and a channel region located between the active regions. The semiconducting material may be made from amorphous silicon or a semiconducting oxide, such as InGaZnO, InWO, InZnO, InSnO, GaOx, InOx and the like. Other suitable materials are within the contemplated scope of disclosure. The semiconducting material may be formed by any suitable method such as CVD, PECVD or atomic layer deposition ALD.

FIG. 1A is a vertical cross-sectional view of a first exemplary structure during prior to formation of an array of protrusion field effect transistors according to an embodiment of the present disclosure. Referring to FIG. 1A, a first exemplary structure according to an embodiment of the present disclosure is illustrated prior to formation of an array of protrusion field-effect transistors. The first exemplary structure includes a substrate 8 that contains a semiconductor material layer 10. The substrate 8 may include a bulk semiconductor substrate such as a silicon substrate in which the semiconductor material layer continuously extends from a top surface of the substrate 8 to a bottom surface of the substrate 8, or a semiconductor-on-insulator layer including the semiconductor material layer 10 as a top semiconductor layer overlying a buried insulator layer (such as a silicon oxide layer). The exemplary structure may include various devices regions, which may include a memory array region 100 in which at least one array of protrusion field-effect transistors may be subsequently formed. The exemplary structure may also include a peripheral region 200 in which electrical connections between each array of protrusion field-effect transistors and a peripheral circuit including field effect transistors may be subsequently formed. Areas of the memory array region 100 and the peripheral region 200 may be employed to form various elements of the peripheral circuit.

Semiconductor devices such as field effect transistors may be formed on, and/or in, the semiconductor material layer 10. For example, shallow trench isolation structures 12 may be formed in an upper portion of the semiconductor material layer 10 by forming shallow trenches and subsequently filling the shallow trenches with a dielectric material such as silicon oxide. Other suitable dielectric materials are within the contemplated scope of disclosure. Various doped wells (not expressly shown) may be formed in various regions of the upper portion of the semiconductor material layer 10 by performing masked ion implantation processes.

Gate structures 20 may be formed over the top surface of the substrate 8 by depositing and patterning a gate dielectric layer, a gate electrode layer, and a gate cap dielectric layer. Each gate structure 20 may include a vertical stack of a gate dielectric 22, a gate electrode 24, and a gate cap dielectric 28, which is herein referred to as a gate stack (22, 24, 28). Ion implantation processes may be performed to form extension implant regions, which may include source extension regions and drain extension regions. Dielectric gate spacers 26 may be formed around the gate stacks (22, 24, 28). Each assembly of a gate stack (22, 24, 28) and a dielectric gate spacer 26 constitutes a gate structure 20. Additional ion implantation processes may be performed that use the gate structures 20 as self-aligned implantation masks to form deep active regions. Such deep active regions may include deep source regions and deep drain regions. Upper portions of the deep active regions may overlap with portions of the extension implantation regions. Each combination of an extension implantation region and a deep active region may constitute an active region 14, which may be a source region or a drain region depending on electrical biasing. A semiconductor channel 15 may be formed underneath each gate stack (22, 24, 28) between a neighboring pair of active regions 14. Metal-semiconductor alloy regions 18 may be formed on the top surface of each active region 14. Field effect transistors may be formed on the semiconductor material layer 10. Each field effect transistor may include a gate structure 20, a semiconductor channel 15, a pair of active regions 14 (one of which functions as a source region and another of which functions as a drain region), and optional metal-semiconductor alloy regions 18. A complementary metal-oxide-semiconductor (CMOS) circuit 330 may be provided on the semiconductor material layer 10, which may include a periphery circuit for the array(s) of protrusion field-effect transistors to be subsequently formed.

As described above and illustrated in FIG. 1A, the transistors in circuit 330 may be planar transistors. However, as discussed in more detail below, the illustrated planar transistors in circuit 330 may also be replaced with FinFETs or protrusion field-effect transistors described below with respect to FIGS. 2A-12B. That is, in various embodiments, the semiconductor channel 15 of the transistors may have a three-dimensional "fin" shape extending from out of the plane of the surface of the substrate 8. The gate structure 20 may be formed on the sidewalls of the fin shaped channel in addition to the top surface of the channel. In alternative embodiments as described in more detail below, the substrate 8 (or any other dielectric layer of the interconnect-level structures) may include dielectric protrusions, rather than the semiconductor channel 15. As such, the semiconductor channel 15 formed over the dielectric protrusions will also have a three-dimensional structure.

Various interconnect-level structures may be subsequently formed, which are formed prior to formation of an array of protrusion field-effect transistors and are herein referred to as lower interconnect-level structures (L0, L1, L2). In case a two-dimensional array of protrusion field-effect transistors is to be subsequently formed over two levels of interconnect-level metal lines, the lower interconnect-level structures (L0, L1, L2) may include a contact-level structure L0, a first interconnect-level structure L1, and a second interconnect-level structure L2. The contact-level structure L0 may include a planarization dielectric layer 31A including a planarizable dielectric material such as silicon oxide and various contact via structures 41V contacting a respective one of the active regions 14 or the gate electrodes 24 and formed within the planarization dielectric layer 31A. The first interconnect-level structure L1 includes a first interconnect level dielectric layer 31B and first metal lines 41L formed within the first interconnect level dielectric layer 31B. The first interconnect level dielectric layer 31B is also referred to as a first line-level dielectric layer. The first metal lines 41L may contact a respective one of the contact via structures 41V. The second interconnect-level structure L2 includes a second interconnect level dielectric layer 32, which may include a stack of a first via-level dielectric material layer and a second line-level dielectric material layer or a line-and-via-level dielectric material layer. The second interconnect level dielectric layer 32 may have formed there within second interconnect-level metal interconnect structures (42V, 42L), which includes first metal via structures 42V and second metal lines 42L. Top surfaces of the second metal lines 42L may be coplanar with the top surface of the second interconnect level dielectric layer 32.

Figure 1B:
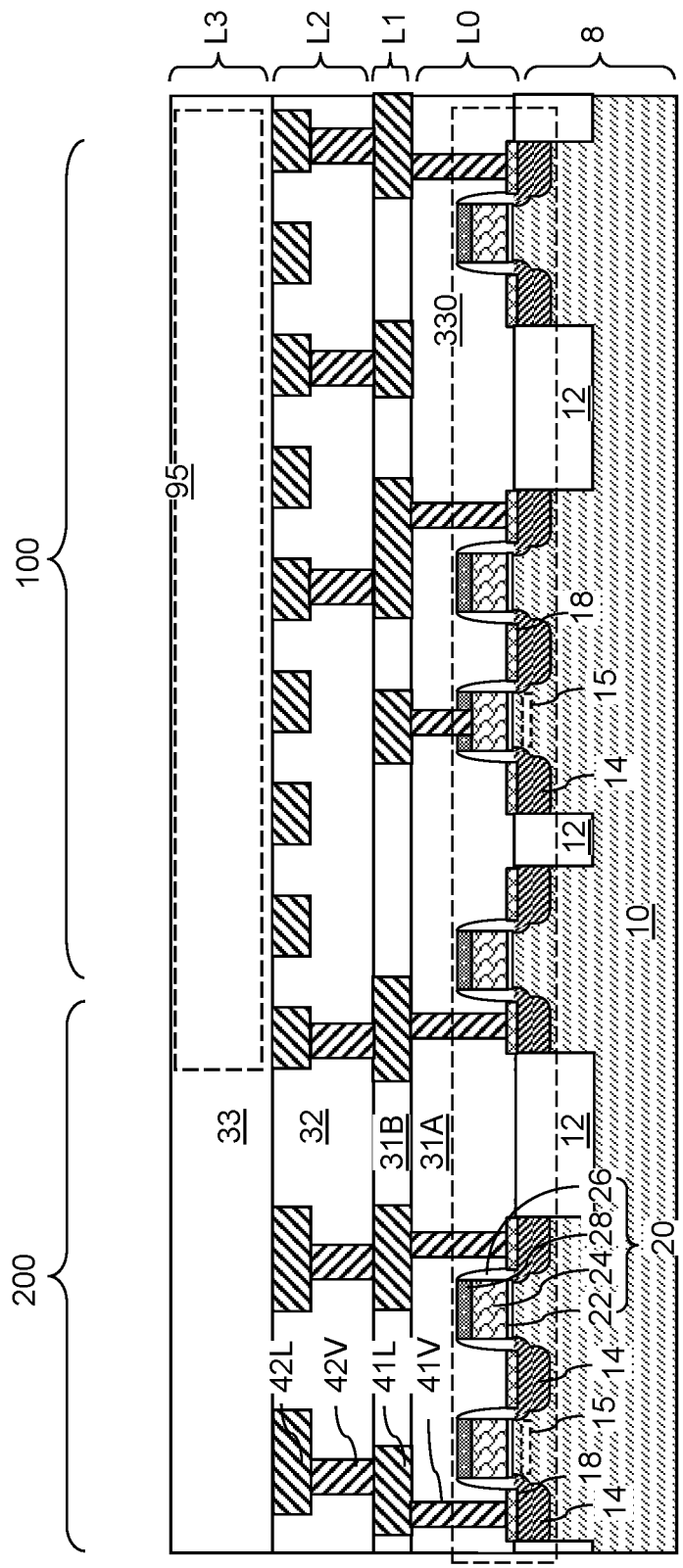
FIG. 1B is a vertical cross-sectional view of the first exemplary structure during after formation of the array of protrusion field effect transistors according to an embodiment of the present disclosure.

FIG. 1B is a vertical cross-sectional view of the first exemplary structure during after formation of the array of protrusion field effect transistors according to an embodiment of the present disclosure. Referring to FIG. 1B, an array 95 of protrusion field-effect transistors may be formed in the memory array region 100 over the second interconnect-level structure L2. The details for the structure and the processing steps for the array 95 of protrusion field effect transistors are subsequently described in detail below. A third interconnect level dielectric layer 33 may be formed during formation of the array 95 of protrusion field-effect transistors. The set of all structures formed at the level of the array 95 of protrusion field-effect transistors is herein referred to as a third interconnect-level structure L3.

Figure 1C:
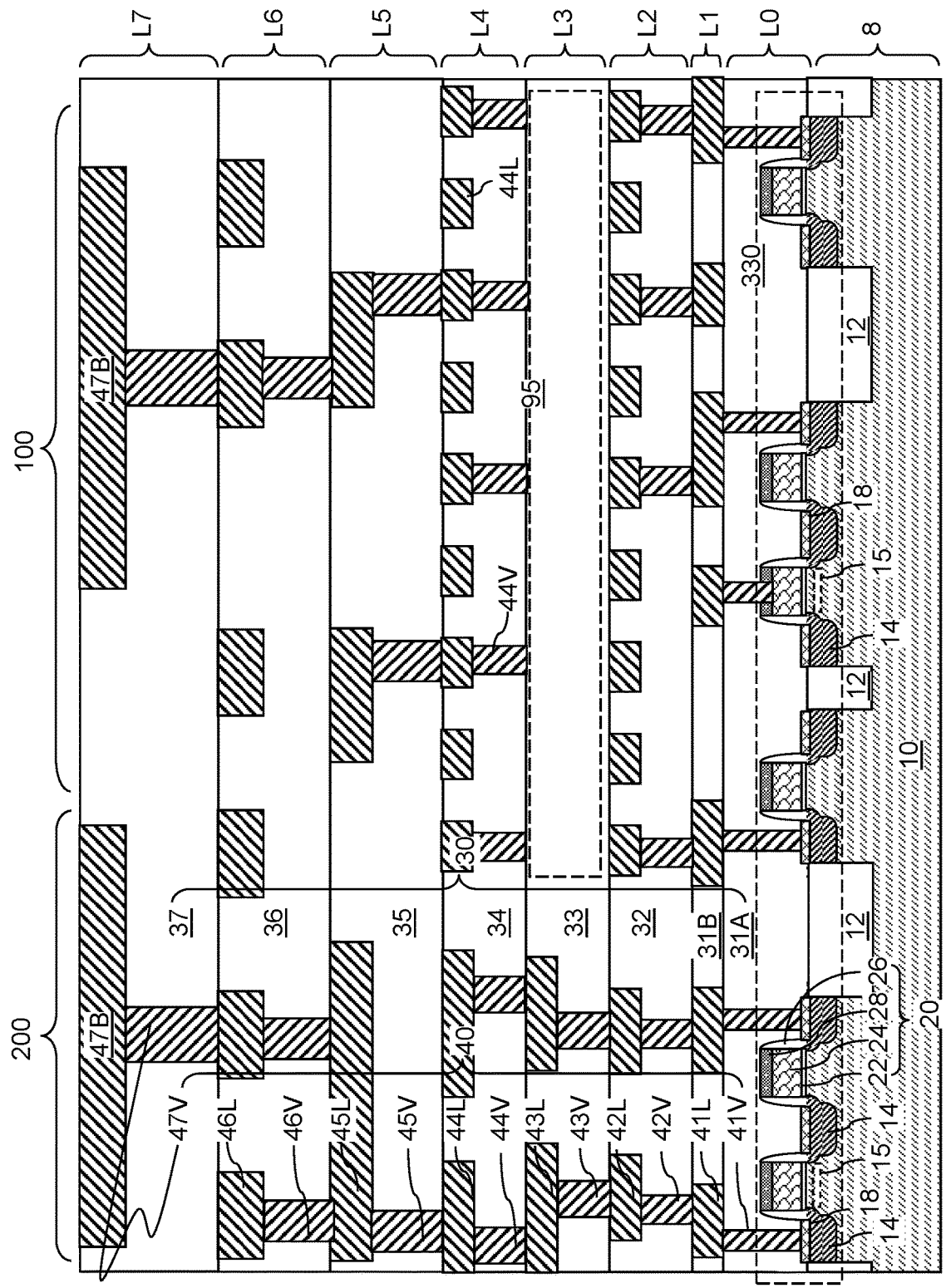
FIG. 1C is a vertical cross-sectional view of the first exemplary structure during after formation of upper-level metal interconnect structures according to an embodiment of the present disclosure.

FIG. 1C is a vertical cross-sectional view of the first exemplary structure during after formation of upper-level metal interconnect structures according to an embodiment of the present disclosure. Referring to FIG. 1C, third interconnect-level metal interconnect structures (43V, 43L) may be formed in the third interconnect level dielectric layer 33. The third interconnect-level metal interconnect structures (43V, 43L) may include second metal via structures 43V and third metal lines 43L. Additional interconnect-level structures may be subsequently formed, which are herein referred to as upper interconnect-level structures (L4, L5, L6, L7). For example, the upper interconnect-level structures (L4, L5, L6, L7) may include a fourth interconnect-level structure L4, a fifth interconnect-level structure L5, a sixth interconnect-level structure L6, and a seventh interconnect-level structure L7. The fourth interconnect-level structure L4 may include a fourth interconnect level dielectric layer 34 having formed therein fourth interconnect-level metal interconnect structures (44V, 44L), which can include third metal via structures 44V and fourth metal lines 44L. The fifth interconnect-level structure L5 may include a fifth interconnect level dielectric layer 35 having formed therein fifth interconnect-level metal interconnect structures (45V, 45L), which can include fourth metal via structures 45V and fifth metal lines 45L. The sixth interconnect-level structure L6 may include a sixth interconnect level dielectric layer 36 having formed therein sixth interconnect-level metal interconnect structures (46V, 46L), which can include fifth metal via structures 46V and sixth metal lines 46L. The seventh interconnect-level structure L7 may include a seventh interconnect level dielectric layer 37 having formed therein sixth metal via structures 47V (which are seventh interconnect-level metal interconnect structures) and metal bonding pads 47B. The metal bonding pads 47B may be configured for solder bonding (which may employ C4 ball bonding or wire bonding), or may be configured for metal-to-metal bonding (such as copper-to-copper bonding).

Each interconnect level dielectric layer may be referred to as an interconnect level dielectric layer (ILD) layer 30. Each interconnect-level metal interconnect structures may be referred to as a metal interconnect structure 40. Each contiguous combination of a metal via structure and an overlying metal line located within a same interconnect-level structure (L2-L7) may be formed sequentially as two distinct structures by employing two single damascene processes, or may be simultaneously formed as a unitary structure employing a dual damascene process. Each of the metal interconnect structure 40 may include a respective metallic liner (such as a layer of TiN, TaN, or WN having a thickness in a range from 2 nm to 20 nm) and a respective metallic fill material (such as W, Cu, Co, Mo, Ru, other elemental metals, or an alloy or a combination thereof). Other suitable materials for use as a metallic liner and metallic fill material are within the contemplated scope of disclosure. Various etch stop dielectric layers and dielectric capping layers may be inserted between vertically neighboring pairs of ILD layers 30, or may be incorporated into one or more of the ILD layers 30.

While the present disclosure is described employing an embodiment in which the array 95 of protrusion field-effect transistors may be formed as a component of a third interconnect-level structure L3, embodiments are expressly contemplated herein in which the array 95 of protrusion field-effect transistors may be formed as components of any other interconnect-level structure (e.g., L1-L7). Further, while the present disclosure describes embodiments in which a set of eight interconnect-level structures are formed, embodiments are expressly contemplated herein in which a different number of interconnect-level structures is employed. In addition, embodiments are expressly contemplated herein in which two or more arrays 95 of protrusion field-effect transistors may be provided within multiple interconnect-level structures in the memory array region 100. While the present disclosure is described employing an embodiment in which an array 95 of protrusion field-effect transistors is formed in a single interconnect-level structure, embodiments are expressly contemplated herein in which an array 95 of protrusion field-effect transistors may be formed over two vertically adjoining interconnect-level structures.

Figure 2A:
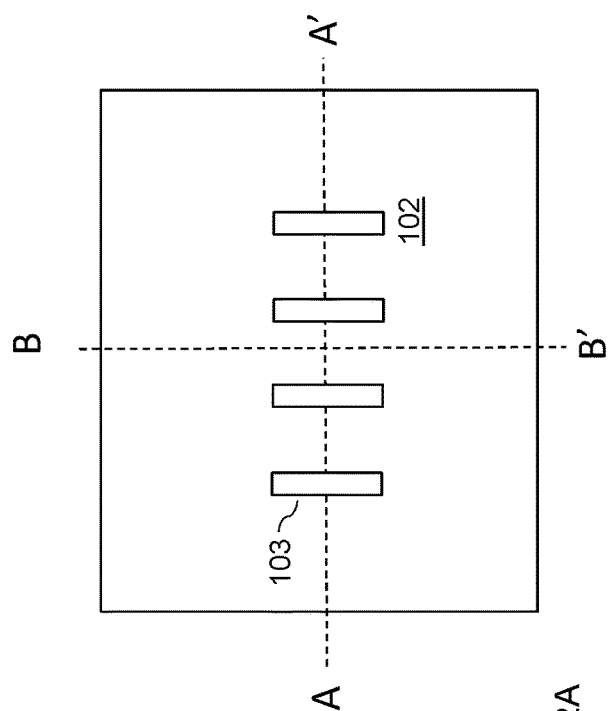
FIG. 2A is a top view illustrating a step of forming protrusions in a substrate in a method of making a transistor according to an embodiment of the present disclosure.
Figure 2B:
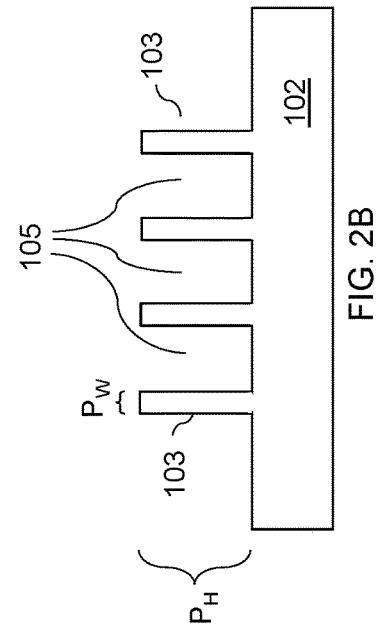
FIG. 2B is a vertical cross-sectional view through line AA' of FIG. 2A.
Figure 2C:
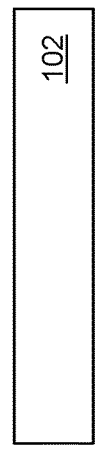
FIG. 2C is a vertical cross-sectional view through line BB' of FIG. 2A.

FIGS. 2A-12 illustrate various protrusion TFTs and methods of making the various protrusion TFTs. FIG. 2A is a top view illustrating a step of forming protrusions in a substrate in a method of making a transistor according to an embodiment of the present disclosure. FIG. 2B is a vertical cross-sectional view through line AA' of FIG. 2A. FIG. 2C is a vertical cross-sectional view through line BB' of FIG. 2A. Referring to FIGS. 2A-2C, a dielectric layer 102 may be provided with a plurality of dielectric protrusions 103 may be formed thereon. The plurality of protrusions may be formed in an one-dimensional array. As defined herein, a one-dimensional array protrusions is an array in which there is a single row or column of protrusions as illustrated in FIG. 2A. As illustrated, the one-dimensional array of dielectric protrusions 103 are formed along the line AA'. A two-dimensional array of dielectric protrusions 103, discussed in more detail below and illustrated in FIG. 9, includes rows and columns of protrusion in the same device. The one-dimensional array may be formed in a second direction perpendicular to a first direction between the active regions. In various embodiments, the plurality of dielectric protrusions 103 may be formed by masking a dielectric layer 102 with a photoresist (not shown) and etching trenches 105 in the dielectric layer 102, thereby forming the plurality of dielectric protrusions 103 between the trenches 105. Alternatively, the dielectric layer 102 may be masked with a photoresist (not shown) and the plurality of dielectric protrusions 103 grown in openings in the dielectric layer 102. In various embodiments, the dielectric layer 102 may be made of a dielectric material such as $SiO_2$. In an alternative embodiment, the dielectric layer 102 may be a top portion of a substrate made of a dielectric material. In various embodiments, the plurality of dielectric protrusions 103 may have a height $P_H$ in the range of 10-250 nm and a width $P_W$ in the range of 3-30 nm. In various embodiments, the plurality of dielectric protrusions 103 may have a protrusion height $P_H$ in the range of 20-200 nm, although higher or lower protrusions heights may be used. In various embodiments, each of the plurality of dielectric protrusions 103 may have a protrusion width $P_W$ in the range of 5-25 nm, although wider or narrower protrusions widths may be used.

Figure 3A:
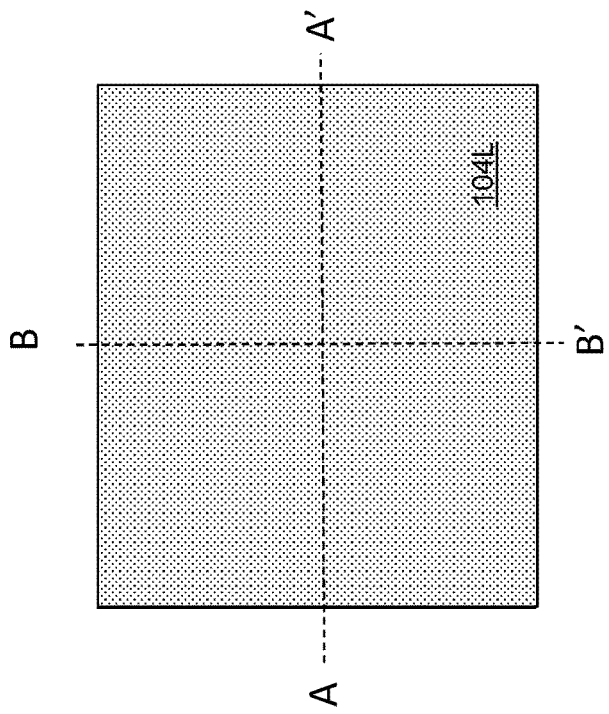
FIG. 3A is a top view illustrating a step of depositing a continuous channel layer over the substrate in a method of making a transistor according to an embodiment of the present disclosure.
Figure 3B:
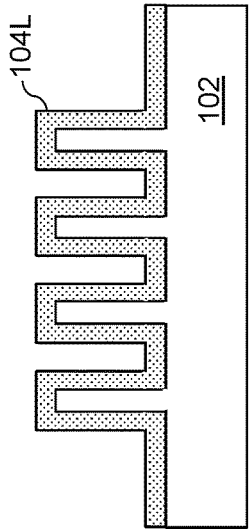
FIG. 3B is a vertical cross-sectional view through line AA' of FIG. 3A.
Figure 3C:
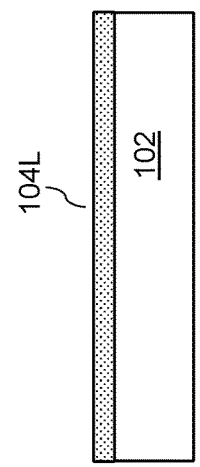
FIG. 3C is a vertical cross-sectional view through line BB' of FIG. 3A.

FIG. 3A is a top view illustrating a step of depositing a continuous channel layer over the substrate in a method of making a transistor according to an embodiment of the present disclosure. FIG. 3B is a vertical cross-sectional view through line AA' of FIG. 3A. FIG. 3C is a vertical cross-sectional view through line BB' of FIG. 3A. Referring to FIGS. 3A-3C, a continuous channel layer 104L may be conformally deposited on the dielectric layer 102 to cover the plurality of dielectric protrusions 103 to form a plurality of trenches between two adjacent dielectric protrusions 103. In this manner, a layer with a substantially uniform thickness may be formed over the plurality of dielectric protrusions 103 and in the trenches 105. In an embodiment, the protrusion TFT may be formed as part of an interconnect structure in an integrated semiconductor device. For example, the protrusion TFT may be formed as part of the third interconnect-level structure L3 in which case the second interconnect level dielectric layer 32 may take the place of the dielectric layer 102. The continuous channel layer 104L may be made any suitable semiconducting material, such amorphous silicon or a semiconducting oxide, such as InGaZnO, InWO, InZnO, InSnO, $GaO_x$, $InO_x$ and the like. Other suitable materials are within the contemplated scope of disclosure. In various embodiments, the continuous channel layer 104L may have a thickness in the range of 1-20 nm, such as 5-15 nm, although greater or lesser thicknesses may be used. The continuous channel layer 104L may be deposited by any suitable technique such as chemical vapor deposition (CVD), plasma enhanced chemical vapor deposition (PECVD) or atomic layer deposition (ALD).

FIG. 4A is a top view illustrating a step of patterning the channel layer in a method of making a transistor according to an embodiment of the present disclosure. FIG. 4B is a vertical cross-sectional view through line AA' of FIG. 4A. FIG. 4C is a vertical cross-sectional view through line BB' of FIG. 4A. Referring to FIGS. 4A-4C, the continuous channel layer 104L may be patterned. To pattern the continuous channel layer 104L, a photoresist (not shown) may be deposited over the continuous channel layer 104L and patterned. The patterned photoresist may then be used as a mask while patterning the continuous channel layer 104L.

The result of patterning the continuous channel layer 104L is a patterned channel layer 104. Patterning may be performed by wet etching or dry etching. After etching, any residual photoresist may be removed by ashing or dissolution with a solvent.

Figure 5A:
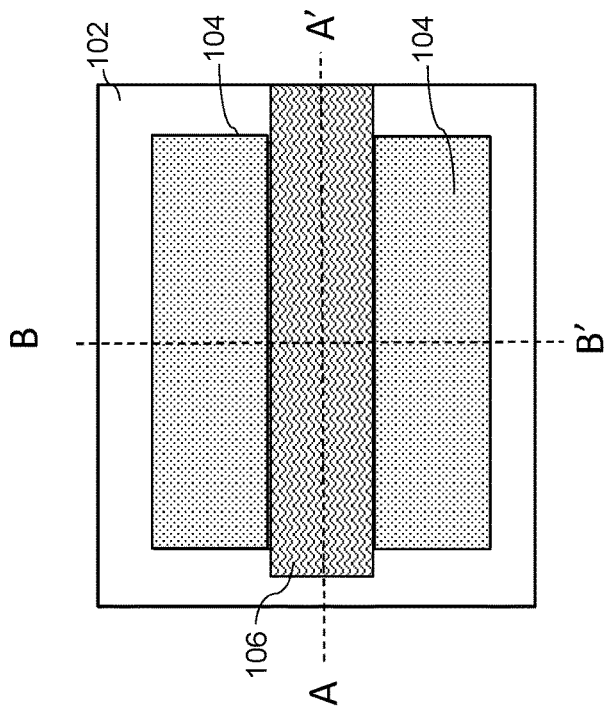
FIG. 5A is a top view illustrating a step of depositing a high k dielectric layer and a metal gate layer over the channel layer in a method of making a transistor according to an embodiment of the present disclosure.
Figure 5B:
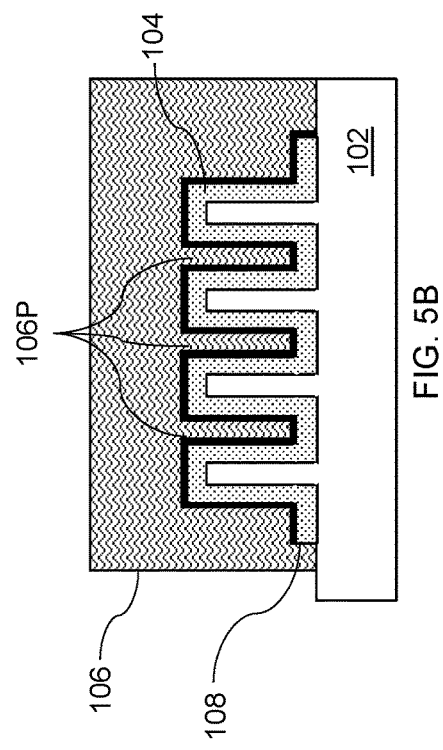
FIG. 5B is a vertical cross-sectional view through line AA' of FIG. 5A.
Figure 5C:
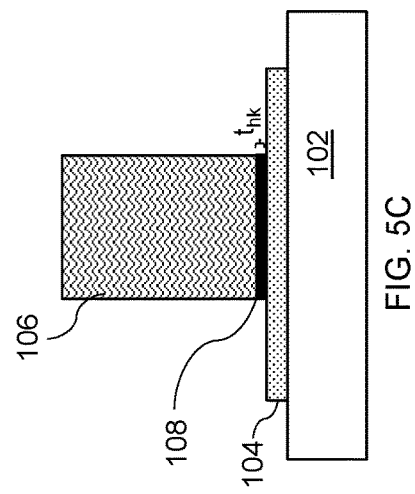
FIG. 5C is a vertical cross-sectional view through line BB' of FIG. 5A.

FIG. 5A is a top view illustrating a step of depositing a high k dielectric layer and a metal gate layer over the channel layer in a method of making a transistor according to an embodiment of the present disclosure. FIG. 5B is a vertical cross-sectional view through line AA' of FIG. 5A. FIG. 5C is a vertical cross-sectional view through line BB' of FIG. 5A. Referring to FIGS. 5A-5C, a high k dielectric layer 108 may be conformally deposited over the dielectric layer 102 and the patterned channel layer 104. Next a gate layer 106 may be deposited over the high k dielectric layer 108. The high k dielectric layer 108 may include, but is not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$). Other suitable materials are within the contemplated scope of disclosure. The gate layer 106 may be made of any suitable metal, such as copper, aluminum, zirconium, titanium, tungsten, tantalum, ruthenium, palladium, platinum, cobalt, nickel or alloys thereof. Other suitable materials are within the contemplated scope of disclosure. The gate layer 106 may be deposited by any suitable technique, such as chemical vapor deposition (CVD), plasma enhanced chemical vapor deposition (PECVD) or atomic layer deposition (ALD). The high k dielectric layer 108 and the gate layer 106 may be formed by first depositing and patterning a photoresist layer (not shown) such that the high k dielectric layer 108 and the gate layer 106 has the shape of a rail as illustrated in FIGS. 5A and 5C. Further, as illustrated in FIG. 5B, gate protrusions 106P may be formed when the trenches 105 between the protrusion on the dielectric layer 102 may be filled with gate material of the gate layer 106. In various embodiments, the high k dielectric layer 108 may have a thickness $t_{hk}$ in the range of 0.5-5 nm, such as 1-4 nm, such as 2.5-3.5 nm, although greater or lesser thicknesses may be used.

Figure 6A:
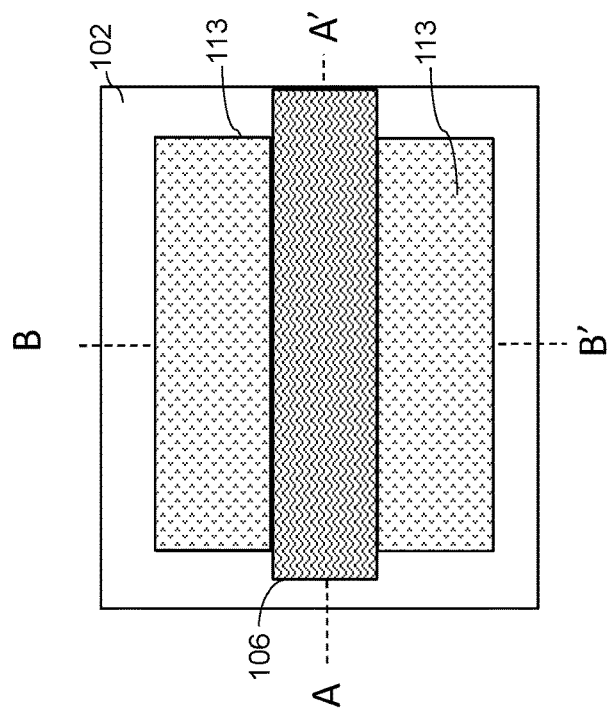
FIG. 6A is a top view illustrating a step of ion implanting the channel layer to form active regions in a method of making a transistor according to an embodiment of the present disclosure.
Figure 6B:
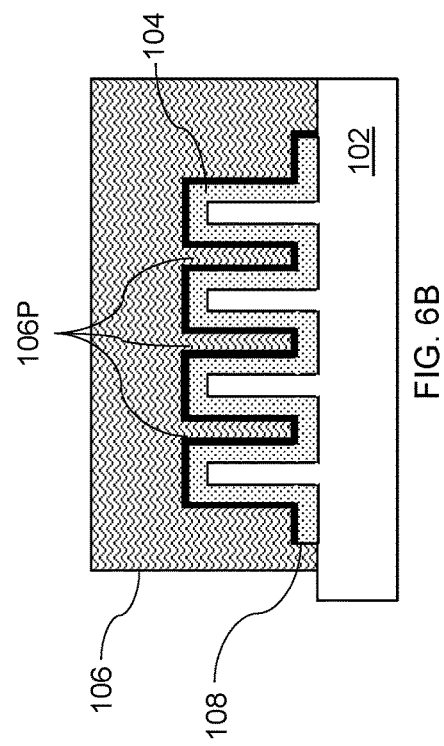
FIG. 6B is a vertical cross-sectional view through line AA' of FIG. 6A.
Figure 6C:
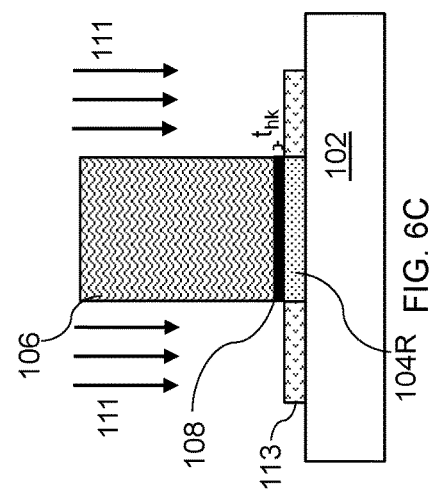
FIG. 6C is a vertical cross-sectional view through line BB' of FIG. 6A.

Referring to FIGS. 6A-6C, portions of the patterned channel layer 104 exposed under the gate layer 106 may be ion implanted 111 to form active regions (e.g., source/drain regions) 113 on either side of a channel region 104R. The active regions 113 may be implanted such that the average atomic concentration of atoms in the active regions 113 is in a range from $1.0\times10^{16}/cm^3$ to $1.0\times10^{20}/cm^3$, such as from $1.0\times10^{17}/cm^3$ to $5.0\times10^{19}/cm^3$, although greater or lesser atomic concentrations may be used. In addition, because the gate layer 106 may be used as a mask when forming the active regions 113, the active regions 113 may be said to be self-aligned to the channel region 104R.

FIG. 7A is a top view illustrating a step of depositing an interconnect level dielectric layer over the intermediate structure illustrated in FIGS. 6A-6C and forming active region contacts in a method of making a transistor according to an embodiment of the present disclosure. FIG. 7B is a vertical cross-sectional view through line AA' of FIG. 7A. FIG. 7C is a vertical cross-sectional view through line BB' of FIG. 7A. Referring to FIGS. 7A-7C, an interconnect level dielectric layer 30 may be deposited over the intermediate structure illustrated in FIGS. 7A-7C. The interconnect level dielectric layer 30 may be made of any suitable material, including but not limited to $SiO_2$. Other suitable materials are within the contemplated scope of disclosure. Via holes (not shown) may then be formed in the interconnect level dielectric layer 30 down to the surface of the active regions 113. Next, the via holes may be filled with a conducting material to form active region via contacts 112. The conducting material may be TiN, W, Al, Cu or any other suitable material. After forming the active region via contacts 112, a planarization step may be performed to planarize the surface of the interconnect level dielectric layer 30 and the top surface of the active region via contacts 112. The planarization step may be performed, for example, by chemical mechanical polishing (CMP). The result is a protrusion field-effect transistor 300.

Referring to FIG. 7B, the resulting protrusion field effect transistor 300 has a three-dimensional patterned channel layer 104, similar to a FinFET. Unlike planar channels, a three-dimensional configuration, such as FinFET technology or in the embodiment protrusion field effect transistor 300, provides numerous advantages over planar FETs. For example, the fin structure may allow higher drive current for a given transistor footprint, which results in higher speed. The three-dimensional structure also may provide lower leakage, which results in lower power consumption. The three-dimensional structure also may provide reduced dopant fluctuation, resulting in better mobility and scaling of the transistor. Thus, the resulting protrusion field effect transistor 300 may be referred to as a three-dimensional field effect transistor. As illustrated in FIG. 7B, the resulting protrusion field-effect transistors 300 has an effective channel width $W_{eff}$ that may be significantly wider than the channel width W (where the channel length is the distance from active region to active region, e.g., source to drain, and the channel width is the distance perpendicular to the channel length). While the channel width W may be the lateral distance of the channel material 108, the effective channel width $W_{eff}$ of the patterned channel layer 104 due to the patterned channel layer 104 following the contour of the dielectric layer 102 and the plurality of dielectric protrusions 103 as indicated by the arrows is significantly longer. As discussed above, the plurality of dielectric protrusions 103 may have a protrusion height $P_H$ in the range of 10-250 nm and a protrusion length $P_L$ in the range of 3-100 nm in various embodiments. The protrusion height $P_H$ may significantly impact the effective channel width $W_{eff}$.

Figure 8A:
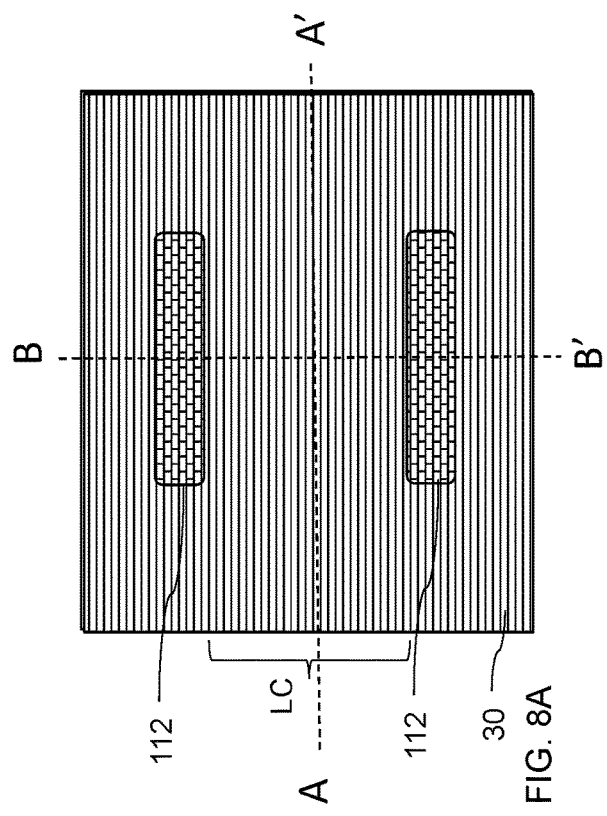
FIG. 8A is a top view illustrating an alternative embodiment of a transistor in which the protrusions are formed in a direction perpendicular to the direction of the protrusions formed in the embodiment illustrated in FIGS. 7A-7C according to an embodiment of the present disclosure.
Figure 8B:
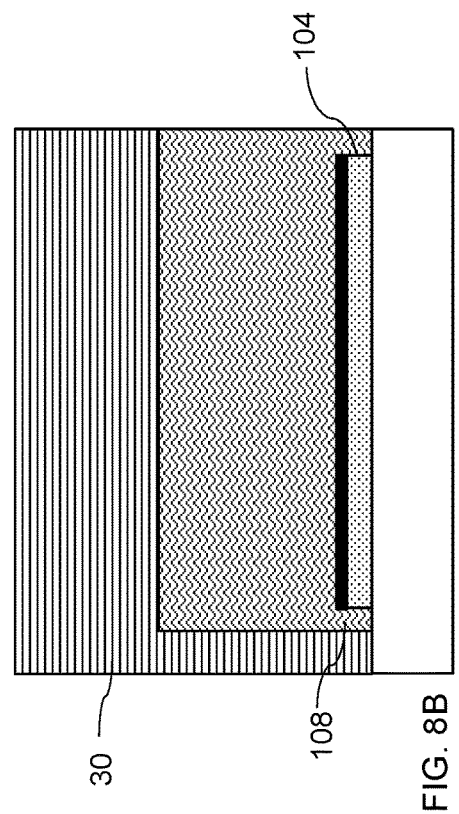
FIG. 8B is a vertical cross-sectional view through line AA' of FIG. 8A.
Figure 8C:
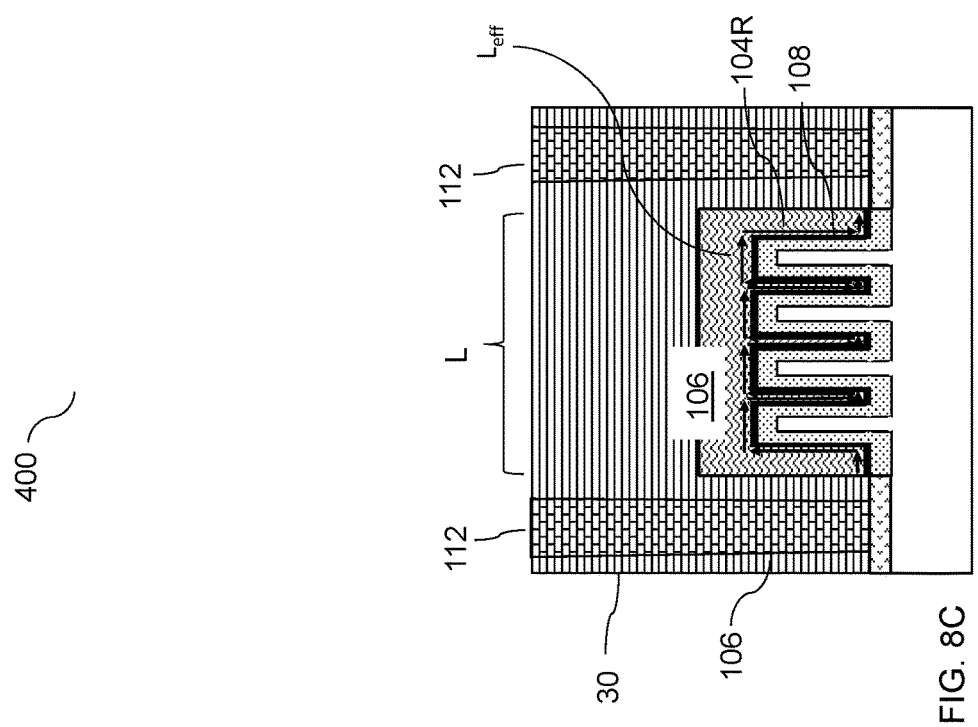
FIG. 8C is a vertical cross-sectional view through line BB' of FIG. 8A.

FIGS. 8A-8C illustrate another embodiment of a protrusion field-effect transistors 400. FIG. 8A is a top view illustrating an alternative embodiment of a transistor in which the protrusions are formed in a direction perpendicular to the direction of the protrusions formed in the embodiment illustrated in FIGS. 7A-7C according to an embodiment of the present disclosure. FIG. 8B is a vertical cross-sectional view through line AA' of FIG. 8A. FIG. 8C is a vertical cross-sectional view through line BB' of FIG. 8A. This embodiment is similar to the protrusion field-effect transistors illustrated in FIGS. 7A-7C. However in this alternative embodiment, a one-dimensional array of a plurality of dielectric protrusions 103 may be in a first direction between the active regions 113. The one-dimensional array of a plurality of dielectric protrusions 103 may formed along the channel length L, i.e., distance between active regions 113. As illustrated in FIG. 8C, the resulting protrusion field-effect transistor 400 has an effective channel length $L_{eff}$ that is significantly longer than the length L of the patterned channel layer 104 due to the patterned channel layer following the contour of the dielectric layer 102 and the plurality of dielectric protrusions 103 from the first active region 113 to the second active region 113 as indicated by the arrows. The effective channel length $L_{eff}$ may vary with the number of the plurality of dielectric protrusions 103 and the dimensions of the protrusions 103. As discussed above, the plurality of dielectric protrusions 103 may have a protrusion height $P_H$ in the range of 10-250 nm and a protrusion length $P_L$ in the range of 3-100 nm in various embodiments. The protrusion height PH may significantly impact the effective channel length $L_{eff}$.

Figure 9:
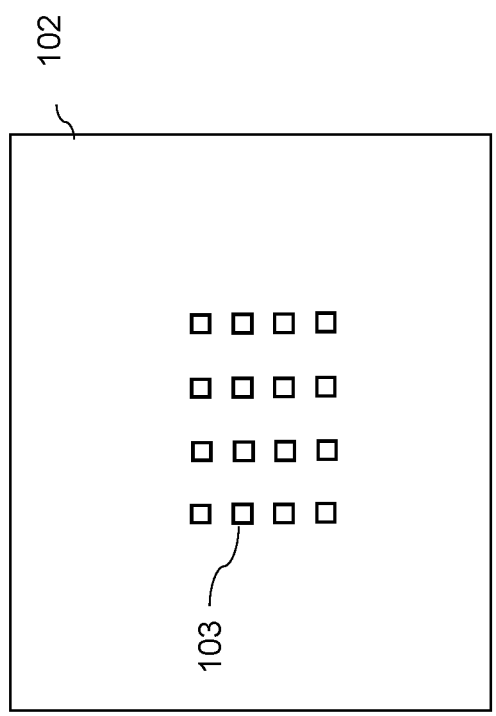
FIG. 9 is a top view illustrating an alternative embodiment of a substrate having a two-dimensional array of protrusions according to an embodiment of the present disclosure.

FIG. 9 is a top view illustrating a step of forming protrusions in a substrate in a method of making a transistor according to a third embodiment of the present disclosure. In the third embodiment of the present disclosure shown in FIG. 8, an array of dielectric protrusions 103 may be formed in both an x and y direction. A channel layer 104 and dielectric layer 108 may be conformally deposited over the array of dielectric protrusions 103. The continuous channel layer 104L may be made any suitable semiconducting material, such amorphous silicon or a semiconducting oxide, such as InGaZnO, InWO, InZnO, InSnO, GaOx, InOx and the like. Other suitable materials are within the contemplated scope of disclosure. In various embodiments, the continuous channel layer 104L may have a thickness in the range of 1-20 nm, such as 5-15 nm, although greater or lesser thicknesses may be used. The continuous channel layer 104L may be deposited by any suitable technique, such as chemical vapor deposition (CVD), plasma enhanced chemical vapor deposition (PECVD) or atomic layer deposition (ALD). The high k dielectric layer 108 may include, but is not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$). Other suitable materials are within the contemplated scope of disclosure. A gate layer 106 may be subsequently deposited over the high-k dielectric layer 108. The gate layer 106 may be made of any suitable metal, such as copper, aluminum, zirconium, titanium, tungsten, tantalum, ruthenium, palladium, platinum, cobalt, nickel or alloys thereof. Other suitable materials are within the contemplated scope of disclosure. The gate layer 106 may be deposited by any suitable technique, such as chemical vapor deposition (CVD), plasma enhanced chemical vapor deposition (PECVD) or atomic layer deposition (ALD).

Figure 10A:
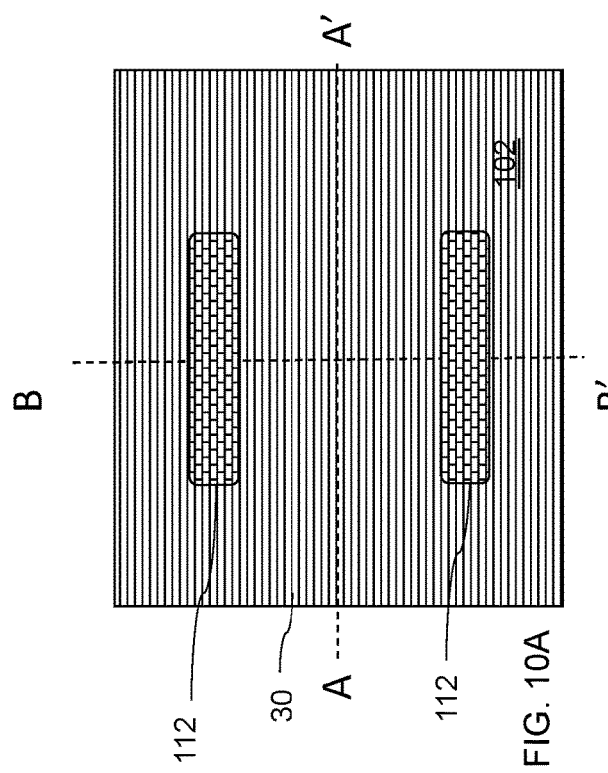
FIG. 10A is a top view illustrating an alternative embodiment of a transistor having a two-dimensional array of protrusions made with the substrate illustrated in FIG. 9 according to an embodiment of the present disclosure.
Figure 10B:
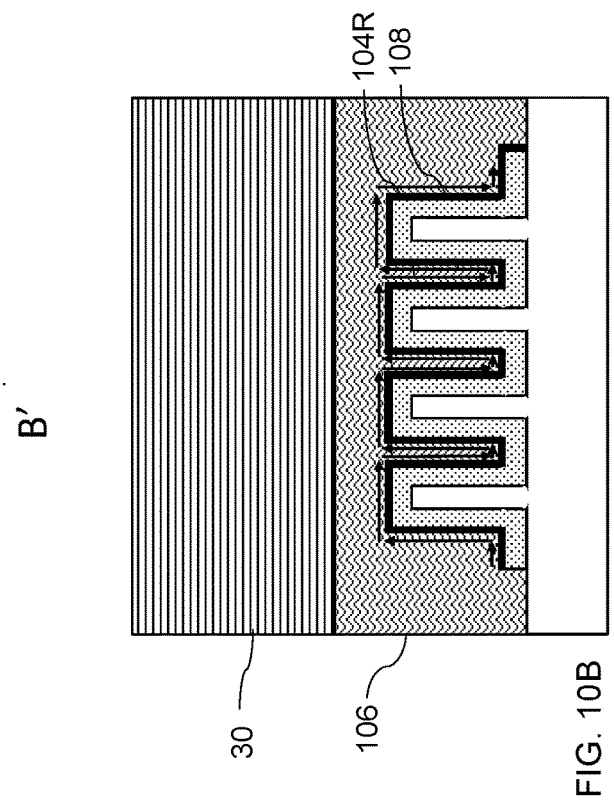
FIG. 10B is a vertical cross-sectional view through line AA' of FIG. 10A.
Figure 10C:
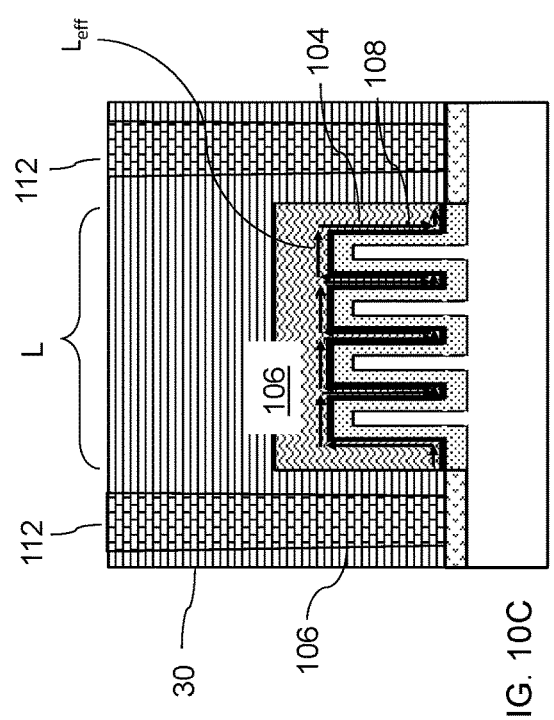
FIG. 10C is a vertical cross-sectional view through line BB' of FIG. 10A.

FIGS. 10A-10C illustrate the top down and vertical cross-sectional views of the completed protrusions field-effect transistor 500 of the third embodiment of the present disclosure. This embodiment is similar to the previous two embodiments. However, as noted above, the protrusion field-effect transistors 500 of the present embodiment includes a two-dimensional array of dielectric protrusions 103 along both the channel width W and the channel length L. Thus, effective channel width $W_{eff}$ and the effective channel length $L_{eff}$ may be greater than the channel width W and the channel length Las measured as the actual distance W between the active regions 113 and along the gate layer 106.

Figure 11A:
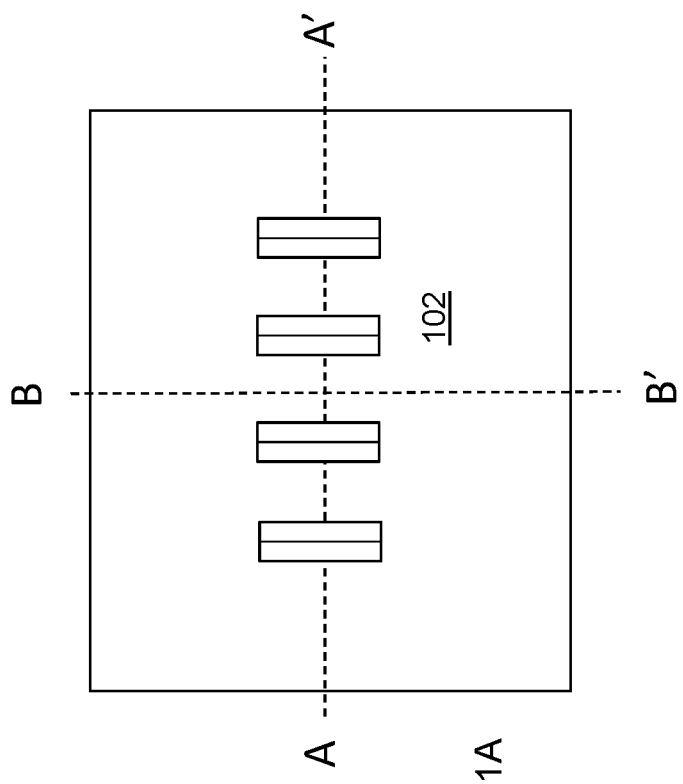
FIG. 11A is a top view illustrating an alternative embodiment of a substrate in which the protrusions have a triangular cross-sectional profile according to an embodiment of the present disclosure.
Figure 11B:
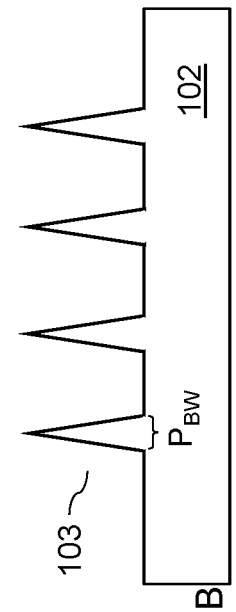
FIG. 11B is a vertical cross-sectional view through line AA' of FIG. 11A.
Figure 11C:
FIG. 11C is a vertical cross-sectional view through line BB' of FIG. 11A.

FIGS. 11A-11C illustrate a dielectric layer 102 according to yet another embodiment. In contrast to the embodiment illustrated in FIGS. 2A and 2B that included rectangular cross section dielectric protrusions 103, in the embodiment as shown in FIGS. 11A-11C, the dielectric protrusions 103 may have an essentially triangular cross-sectional profile. That is, a base of the dielectric protrusions 103 proximally to the top surface of the dielectric layer 102 may be wider than a tip portion located distally from the top surface of the dielectric layer 102. The plurality of dielectric protrusions 103 may comprise first ends proximal to a substrate 102 and second ends distal from the substrate 102 and wherein a width of the first ends is wider than a width of the second ends. The triangular cross-sectional area protrusions 103 of the instant embodiment continue to increase the effective channel length $L_{eff}$ and/or effective channel width $W_{eff}$. However, the protrusion height $P_H$ as well as the protrusion base width $P_{BW}$ may impact the effective channel width $W_{eff}$ and the effective channel length $L_{eff}$.

Figure 12A:
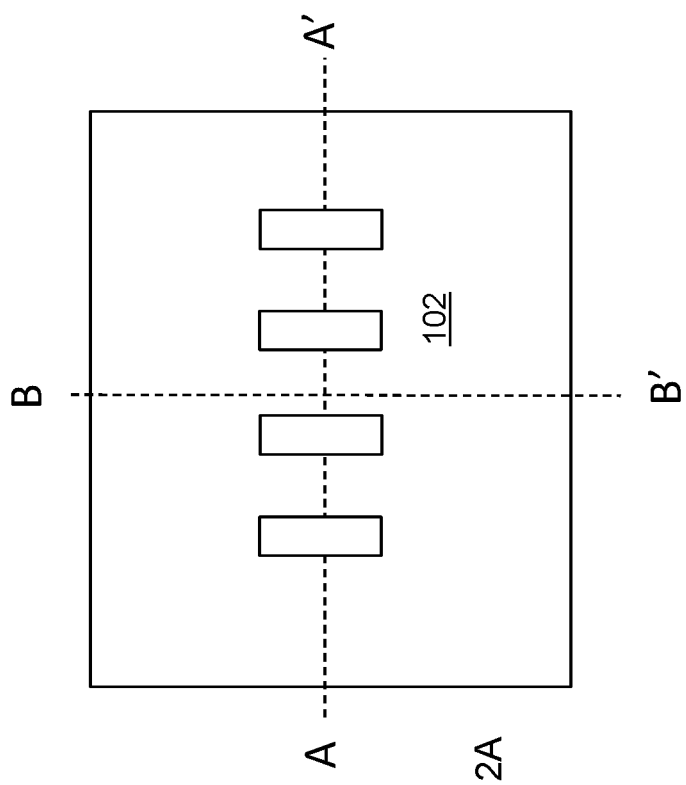
FIG. 12A is a top view illustrating an alternative embodiment of a substrate in which the protrusions have a rounded triangular cross-sectional profile according to an embodiment of the present disclosure.
Figure 12B:
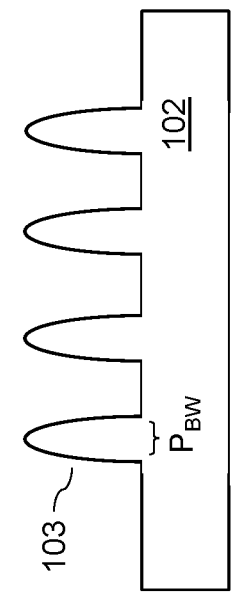
FIG. 12B is a vertical cross-sectional view through line AA' of FIG. 12A.
Figure 12C:
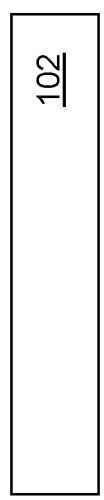
FIG. 12C is a vertical cross-sectional view through line BB' of FIG. 12A.

FIGS. 12A-12C illustrate a dielectric layer 102 according to yet another embodiment. In contrast to the embodiment illustrated in FIGS. 2A and 2B that included rectangular cross section dielectric protrusions 103, in the embodiment as shown in FIGS. 12A-12C, the dielectric protrusions 103 may have a "rounded triangular" cross-sectional profile. As in the previous embodiment, a base of the protrusions 103 proximally to the top surface of the dielectric layer 102 may be wider than a tip portion located distally from the top surface of the dielectric layer 102. However, in this embodiment, the cross section of the dielectric protrusions 103 may have a sinusoidal, parabolic or other curved shape. That is, a base of the protrusions 103 proximally to the top surface of the dielectric layer 102 may be wider than a tip portion located distally from the top surface of the dielectric layer 102. The "rounded triangular" cross-sectional area protrusions 103 of the instant embodiment continue to increase the effective channel length $L_{eff}$ and/or effective channel width $W_{eff}$. However, the protrusion height $P_H$ as well as the protrusion base width $P_{BW}$ and radius of curvature may impact the effective channel width $W_{eff}$ and the effective channel length $L_{eff}$.

In another embodiment, the continuous channel layer 104L of any of the above embodiments may be doped with a dopant selected to improve the stability of the continuous channel layer 104L. Dopants which may improve the stability of the channel layer 104L. For example, the channel layer 104L may be doped with Si. Other suitable dopants to improve the stability of the channel layer 104L are within the contemplated scope of disclosure.

In another embodiment, the continuous channel layer 104L may comprise a laminated structure. In an aspect, the layers of the laminated structure include layers of $In_xGa_yZn_zO$ with different mol percent of In, Ga and Zn. In an embodiment, 0<x≤0.5, 0<y≤0.5 and 0<z≤0.5. In various embodiments, the layers of the laminated structure include layers of other oxides, such as but not limited to, InWO, InZnO, InSnO, $GaO_x$ and $InO_x$.

Figure 13:
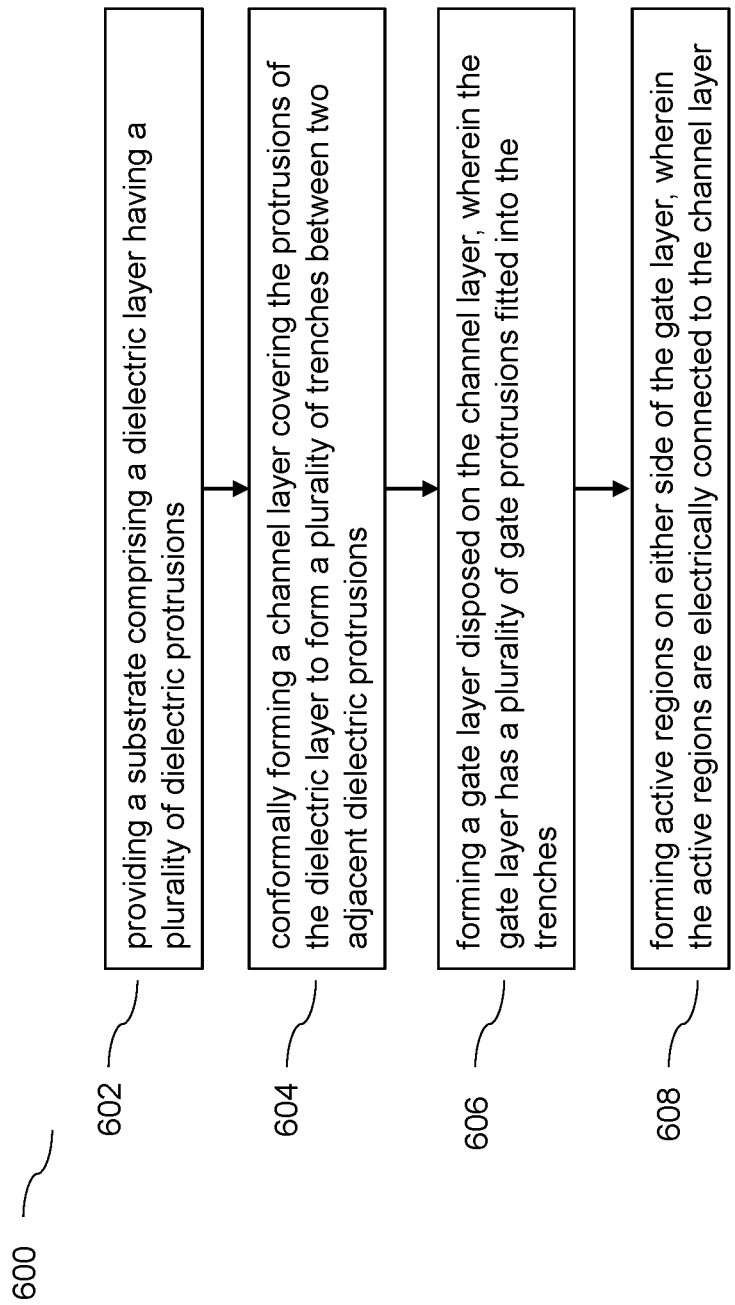
FIG. 13 is a flowchart that illustrates the general processing steps of the methods of the present disclosure.

FIG. 13 is a flow diagram illustrating a general method 600 of making a protrusion field-effect transistors 300, 400, 500. Referring to step 602, the method includes a step of providing a substrate comprising a dielectric layer 102 having a plurality of dielectric protrusions 103. Referring to step 604, the method includes a step of conformally forming a channel layer 104 over the plurality of dielectric protrusions 103 of the dielectric layer 102 to form a plurality of trenches 105 between two adjacent dielectric protrusions 103. Referring to step 606, the method includes a step of forming a gate layer 106 disposed on the channel layer 104, wherein the gate layer 106 has a plurality of gate protrusions 106P fitted into the trenches 105. Referring to step 608, the method includes a step of forming active regions 113 on either side of the gate layer 106, wherein the active regions 113 may be electrically connected to the channel layer 104.

Generally, the structures and methods of the present disclosure can be used to form protrusion field-effect transistors and at least one layer of a two-dimensional array of protrusion field effect transistors in a metal interconnect level of the back-end-of line. Field-effect transistors (TFTs) are attractive for BEOL integration since they can be processed at low temperature and can add functionality to the BEOL while freeing up area in the FEOL. Use of TFTs in the BEOL may be used as a scaling path for N3 or beyond by moving peripheral devices such as power gates or I/O devices from the FEOL into higher metal levels of the BEOL. Moving the TFTs from the FEOL to the BEOL may result in about 5-10% area shrink for a given device.

An embodiment is drawn to a transistor, including a dielectric layer 102 having a plurality of dielectric protrusions 103, a channel layer 104 conformally covering the plurality of dielectric protrusions 103 of the dielectric layer 102 to form a plurality of trenches 105 between two adjacent dielectric protrusions 103, a gate layer 106 disposed on the channel layer. The gate layer 106 has a plurality of gate protrusions 106P fitted into the trenches 105. The transistor also includes active regions 113 formed on either side of the gate layer 106. active regions 113 are electrically connected to the channel layer 104.

Another embodiment is drawn to an integrated semiconductor device including protrusion field effect transistors 300, 400, 500 located in a back-end-of line (BEOL) portions of the integrated semiconductor device. The protrusion field effect transistors 300, 400, 500 include a dielectric layer 102 having a plurality of dielectric protrusions 103, a channel layer 104 conformally covering the protrusions 103 of the dielectric layer 102 to form a plurality of trenches 105 between two adjacent dielectric protrusions 103 and a gate layer 106 disposed on the channel layer 104. The gate layer 106 has a plurality of gate protrusions 106P fitted into the trenches 105. The protrusion field effect transistors 300, 400, 500 also include active regions 113 may be formed on either side of the gate layer 106. The active regions 113 are electrically connected to the channel layer 104.

Another embodiment is drawn to a method of a method of making a protrusion field effect transistor 300, 400, 500 including providing a substrate comprising a dielectric layer 102 having a plurality of dielectric protrusions 103, conformally forming a channel layer 104 covering the protrusions 103 of the dielectric layer 102 to form a plurality of trenches 105 between two adjacent dielectric protrusions 103, forming a gate layer 106 disposed on the channel layer. The gate layer 106 has a plurality of gate protrusions 106P fitted into the trenches 105. The method also includes forming active regions 113 on either side of the gate layer 106. The active regions 113 are electrically connected to the channel layer 104.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a transistor, wherein the transistor comprises:
   a dielectric layer having a plurality of dielectric protrusions that are laterally spaced apart at least along a first horizontal direction;
   a channel layer conformally covering the plurality of dielectric protrusions and having a uniform thickness throughout;
   a gate layer disposed over the channel layer and comprising a horizontally-extending gate portion that overlies the plurality of dielectric protrusions and further comprising a plurality of gate protrusions that extend downward from the horizontally-extending gate portion; and
   active regions formed on either side of the gate layer, electrically connected to the channel layer, and laterally spaced apart from each other along a second horizontal direction that is different from the first horizontal direction,
   wherein the plurality of gate protrusions comprises at least one one-dimensional array of gate protrusions that are arranged along the second horizontal direction.

2. The semiconductor structure of claim 1, wherein the plurality of gate protrusions comprises a one-dimensional array of gate protrusions that are arranged along the first horizontal direction.

3. The semiconductor structure of claim 1, wherein the plurality of gate protrusions comprises a two-dimensional array of gate protrusions that are arranged along the first horizontal direction and along the second horizontal direction.

4. The semiconductor structure of claim 1, wherein:
   the plurality of dielectric protrusions comprise first ends proximal to a substrate and second ends distal from the substrate; and
   a width of the first ends is wider than a width of the second ends.

5. The semiconductor structure of claim 4, wherein each of the plurality of dielectric protrusions has a triangular vertical cross-sectional profile.

6. The semiconductor structure of claim 4, wherein each of the plurality of dielectric protrusions has a rounded triangular vertical cross-sectional profile.

7. The semiconductor structure of claim 1, wherein the active regions have a same thickness as the uniform thickness of the channel layer.

8. The semiconductor structure of claim 1, wherein the channel layer comprises a laminated structure that includes layers of InWO, InZnO, InSnO, $GaO_x$, $InO_x$ or combinations thereof.

9. The semiconductor structure of claim 1, wherein the channel layer comprises a laminated structure that includes layers of InGaZnO having different concentrations of In, Ga and Zn.

10. The semiconductor structure of claim 1, further comprising:
    a substrate that underlies the dielectric layer;
    a complementary metal-oxide-semiconductor (CMOS) circuit comprising field effect transistors and located on the substrate; and
    interconnect-level dielectric material layers embedding metal interconnect structures and located between the CMOS circuit and the dielectric layer.

11. The semiconductor structure of claim 1, further comprising:
    an interconnect level dielectric (ILD) layer laterally surrounding, contacting sidewalls of, and overlying, the gate layer and the active regions; and
    an active region via vertically extending through the ILD layer and contacting a top surface of a respective one of the active regions.

12. An integrated semiconductor device comprising:
protrusion field-effect transistors located in a back-end-of line (BEOL) portions of the integrated semiconductor device, the protrusion field-effect transistors comprising:
    a dielectric layer having a plurality of dielectric protrusions that are laterally spaced apart at least along a first horizontal direction;
    a channel layer conformally covering the plurality of dielectric protrusions and having a uniform thickness throughout;
    a gate layer disposed over the channel layer and comprising a horizontally-extending gate portion that overlies the plurality of dielectric protrusions and further comprising a plurality of gate protrusions that extend downward from the horizontally-extending gate portion; and
    active regions formed on either side of the gate layer, electrically connected to the channel layer, and laterally spaced apart from each other along a second horizontal direction that is different from the first horizontal direction,
    wherein the plurality of gate protrusions comprises at least one one-dimensional array of gate protrusions that are arranged along the second horizontal direction.

13. The integrated semiconductor device of claim 12, wherein the protrusion field effect transistor comprises a power gate, a logic transistor, an input/output device or a selector for a memory element.

14. The integrated semiconductor device of claim 12, wherein the plurality of gate protrusions comprises a two-dimensional array of gate protrusions that are arranged along the first horizontal direction and along the second horizontal direction.

15. The integrated semiconductor device of claim 12, wherein the channel layer comprises a laminated structure that includes layers of InGaZnO having different concentrations of In, Ga and Zn.

16. A method of making a protrusion field effect transistor comprising:
    forming a dielectric layer having a plurality of dielectric protrusions that are laterally spaced apart at least along a first horizontal direction over a substrate;
    conformally forming a channel layer covering the plurality of dielectric protrusions;
    forming a gate layer over the channel layer, wherein the gate layer comprises a horizontally-extending gate portion that overlies the plurality of dielectric protrusions and further comprises a plurality of gate protrusions that extend downward from the horizontally-extending gate portion; and
    forming active regions on either side of the gate layer, wherein the active regions are electrically connected to the channel layer, and are laterally spaced apart from each other along a second horizontal direction that is different from the first horizontal direction, wherein:
    the plurality of dielectric protrusions comprise first ends proximal to a substrate and second ends distal from the substrate; and
    a width of the first ends is wider than a width of the second ends.

17. The method of claim 16, wherein the plurality of gate protrusions comprises a one-dimensional array of gate protrusions that are arranged along the first horizontal direction.

18. The method of claim 16, wherein the plurality of gate protrusions comprises at least one one-dimensional array of gate protrusions that are arranged along the second horizontal direction.

19. The method of claim 16, wherein the plurality of gate protrusions comprises a two-dimensional array of gate protrusions that are arranged along the first horizontal direction and along the second horizontal direction.

20. The method of claim 16, wherein the channel layer comprises a laminated structure that includes layers of InGaZnO having different concentrations of In, Ga and Zn.

\* \* \* \* \*